(12) United States Patent
Khan et al.

(10) Patent No.: US 7,009,424 B2
(45) Date of Patent: Mar. 7, 2006

(54) SINGLE SUPPLY LEVEL SHIFTER

(75) Inventors: Qadeer A. Khan, New Delhi (IN); Sanjay K. Wadhwa, Uttar Pradesh (IN); Kulbhushan Misri, Haryana (IN)

(73) Assignee: Freescale Semiconductor, Inc, Austin, TX (US)

( * ) Notice: Subject to any disclaimer, the term of this patent is extended or adjusted under 35 U.S.C. 154(b) by 29 days.

(21) Appl. No.: 10/865,269

(22) Filed: Jun. 10, 2004

(65) Prior Publication Data

US 2005/0275429 A1    Dec. 15, 2005

(51) Int. Cl.
*H03K 19/0175* (2006.01)

(52) U.S. Cl. .......................................... 326/81; 326/68

(58) Field of Classification Search .................. 326/81, 326/68; 327/333

See application file for complete search history.

(56) References Cited

U.S. PATENT DOCUMENTS

| | | | |
|---|---|---|---|
| 4,150,308 A | 4/1979 | Adlhoch | 326/68 |
| 6,819,159 B1 * | 11/2004 | Lencioni | 327/333 |
| 6,850,090 B1 * | 2/2005 | Aoki | 326/68 |
| 2003/0001655 A1 | 1/2003 | Jeong | 327/333 |
| 2003/0098711 A1 | 5/2003 | Tsuboi et al. | 326/81 |

* cited by examiner

*Primary Examiner*—Peguy JeanPierre
(74) *Attorney, Agent, or Firm*—Charles Bergere

(57) ABSTRACT

A level shifter that shifts a low supply voltage input signal to a higher supply voltage output signal includes a first unit and a second unit. The first unit is connected to a high power supply voltage source and receives the input signal. The first unit acts as a startup circuit such that when the level shifter is switched on, the first unit discharges an output node if the input signal is a logic low, and when the input signal is a logic high, the first unit charges a control node to the voltage of the input signal. The second unit is connected to the first unit and the high power supply voltage source, and also receives the input signal. The second unit shifts the input signal to the higher supply voltage output signal. The level shifter operates only at the high power supply voltage.

4 Claims, 3 Drawing Sheets

SINGLE SUPPLY LEVEL SHIFTER

BACKGROUND OF THE INVENTION

The present invention relates generally to digital logic circuits and, more particularly, to level shifter circuits for shifting a digital signal between two voltage levels.

Digital logic circuits are widely used in the areas of electronics and computers. However, with advances in circuit technology, the various digital logic circuits that communicate with one another may operate at different power supply voltages. For example, a digital integrated circuit may include an input/output (I/O) section that operates at a first logic level, and a central logic core that operates at a second, lower supply voltage, since operating at the lower voltage reduces power consumption. On the other hand, the supply voltage for the I/O section must be kept at a higher supply voltage than the logic core to ensure a higher signal to noise ratio. For example, the I/O section may operate at supply voltages ranging from 3.3V to 5V, while the logic core operates at 0.5V to 1.5V. Therefore, an interface is required to ensure smooth communication between different digital logic circuits operating at different voltages.

In particular, an interface is required that allows a shift in the voltage of a digital signal from a low supply voltage (VDD) level to a higher supply voltage (VDDa) level. This voltage level shifter acts as an interface between a chip or circuit operating at the low power supply voltage (VDD) and a chip or circuit operating at the higher power supply voltage (VDDa). The conventional voltage level shifter is included as a part of the chip operating at VDDa. This level shifter requires both supply voltages, VDD and VDDa, for its operation.

The conventional level shifter has limitations since it operates on dual supply voltages, i.e., both VDD and VDDa. Consequently, during the fabrication of the level shifter, connections to both VDD and VDDa are required. Extra connections lead to a congestion in the circuit layout, as well as extra pin counts. Hence, the effectiveness of the level shifter is reduced. Currently, the above-mentioned limitations are overcome by using a larger chip area, but this leads to an increase in fabrication cost. Alternatively, there is a compromise in the performance to reduce the cost.

Hence, there is a need for a level shifter that does not require dual supply voltages, and that reduces layout congestion and pin count.

BRIEF DESCRIPTION OF THE DRAWINGS

The following detailed description of the preferred embodiments of the invention will be better understood when read in conjunction with the appended drawings. The present invention is illustrated by way of example and not limited by the accompanying figures, in which like references indicate similar elements.

DETAILED DESCRIPTION OF THE INVENTION

The following detailed description set forth below in connection with the appended drawings, is intended as a description of the presently preferred embodiments of the invention, and is not intended to represent the only form in which the present invention may be practiced. It is to be understood that the same or equivalent functions may be accomplished by different embodiments that are intended to be encompassed within the spirit and scope of the invention.

The present invention is a level shifter that operates using a single supply voltage source. The level shifter shifts a low supply voltage input signal to a higher supply voltage output signal. The level shifter includes a first unit and a second unit. The first unit is connected to a high power supply voltage source and receives the input signal. The first unit acts as a startup circuit such that when the level shifter is powered on, the first unit discharges an output node if the input signal is a logic low. The second unit is connected to the first unit and the high power supply voltage source, and receives the input signal. The second unit shifts the input signal to the higher supply voltage output signal.

The present invention has the advantage that only the high power supply voltage source is used to operate the level shifter. Hence, the pin-count and layout congestion of a chip incorporating the level shifter are reduced. This leads to a reduction in the cost and an improvement in the performance of the chip. Further, the circuit can be used as a standard cell for various applications.

Figure 1:
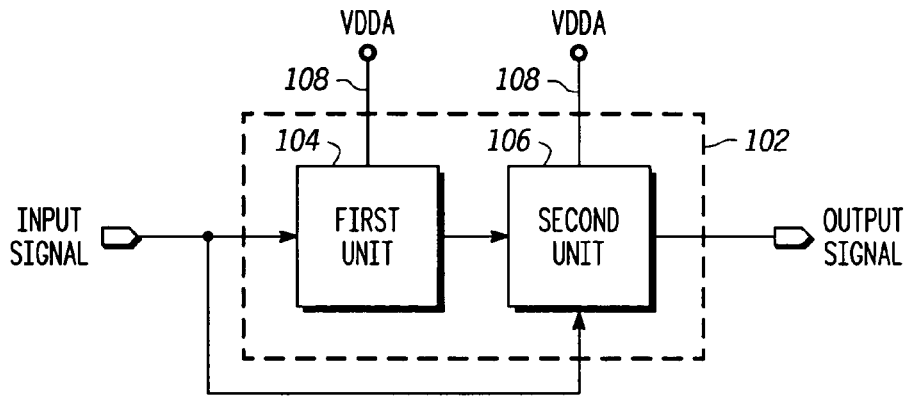
FIG. 1 is a schematic block diagram illustrating a level shifter, according to an exemplary embodiment of the present invention.

FIG. 1 is a schematic block diagram illustrating a level shifter 102, according to an exemplary embodiment of the present invention. The level shifter 102 receives an input signal and generates an output signal. Logic high for the input signal corresponds to a low power supply voltage, hereinafter referred to as VDD, whereas a logic low corresponds to a reference voltage, hereinafter referred to as Vref. Logic high for the output signal corresponds to a high power supply voltage, hereinafter referred to as VDDa (VDDa>VDD), and a logic low output signal corresponds to the reference voltage, Vref.

The level shifter 102 comprises a first unit 104 and a second unit 106. The first unit 104 is connected to a high power supply voltage source 108 that operates at the voltage VDDa. The first unit 104 receives the input signal. The first unit 104 acts as a start-up circuit for the level shifter 102. When the level shifter 102 is powered on, the first unit 104 operates, depending on the logic value of the input signal. If the input signal is logic low, the first unit 104 discharges an output node of the level shifter 102. The second unit 106 is connected to the first unit 104 and the high power supply voltage source 108. The second unit 106 also receives the input signal. The second unit 106 shifts the input signal to the output signal. That is, the second unit 106 shifts the input signal from the low power supply voltage to a high power supply voltage (i.e., from VDD to VDDa).

Figure 2:
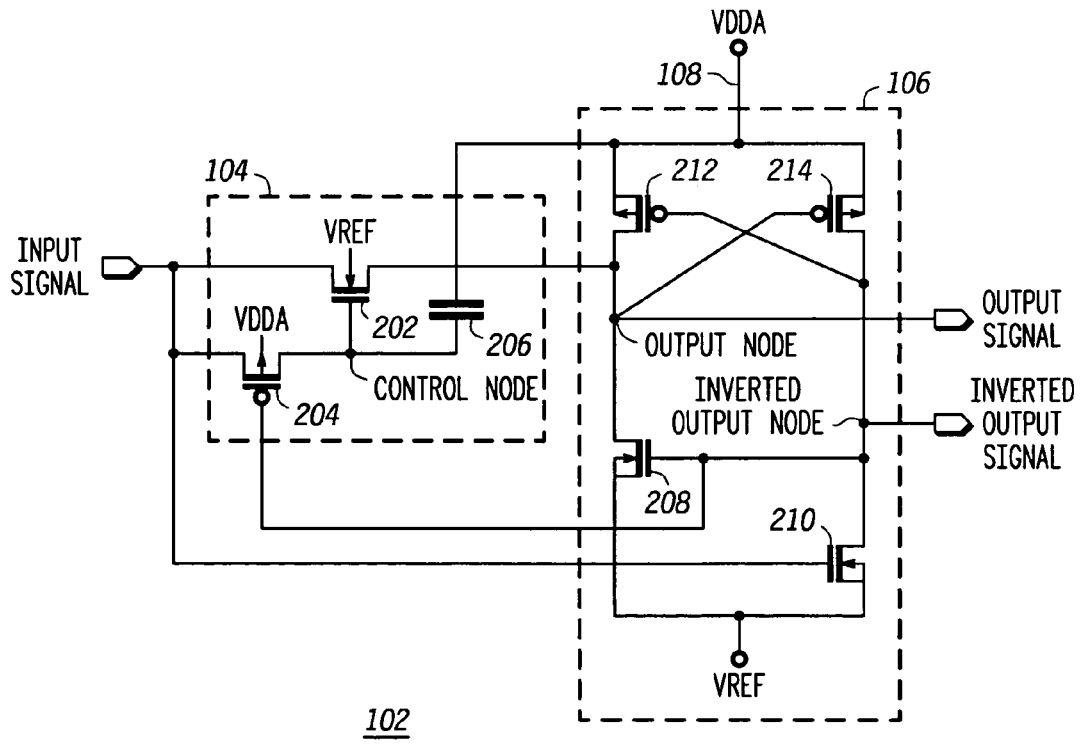
FIG. 2 is a schematic circuit diagram illustrating the level shifter, according to an exemplary embodiment of the present invention.

FIG. 2 is a schematic circuit diagram illustrating the level shifter 102, according to an exemplary embodiment of the present invention. The first unit 104 comprises a first NMOS transistor 202, a first PMOS transistor 204, and a capacitor 206. The second unit 106 comprises a second NMOS transistor 208, a third NMOS transistor 210, a second PMOS transistor 212, and a third PMOS transistor 214.

It will be noted that unless specified, the bulk of a PMOS transistor is connected to the high power supply voltage VDDa, and the bulk of a NMOS transistor is connected to the reference voltage Vref.

The sources of the first NMOS transistor 202 and first PMOS transistor 204 receive the input signal. The gate of the first NMOS transistor 202 is connected to the drain of the first PMOS transistor 204 at the control node. A first terminal of the capacitor 206 is connected to the high power supply voltage source 108. A second terminal of the capacitor 206 is connected to the gate of the first NMOS transistor 202 and the drain of first PMOS transistor 204 at a control node.

The gate of the second NMOS transistor 208 is connected to the gate of the first PMOS transistor 204. The sources of the second and third NMOS transistors 208 and 210 are connected to the reference voltage Vref. The drain of the second NMOS transistor 208 is connected to the drains of the second PMOS transistor 212 and the first NMOS transistor 202 at the output node. The gate of the third NMOS transistor 210 receives the input signal. The drain of the third NMOS transistor 210 is connected to the gate of the second NMOS transistor 208 and the drain of the third PMOS transistor 214 at a node labeled inverted output node. The sources of the second and third PMOS transistors 212 and 214 are connected to the high power supply voltage source 108. The gate of the second PMOS transistor 212 is connected to the drain of the third NMOS transistor 210. The gate of the third PMOS transistor 214 is connected to the drain of the second NMOS transistor 208 at the output node. The output signal of the level shifter 102 is generated at the output node.

The operation of the level shifter 102 illustrated in FIG. 2 is described hereinafter.

If the input signal is logic high, i.e., the input signal is at VDD, the third NMOS transistor 210 is turned on. Consequently, the voltage at the drain of the third NMOS transistor 210 is pulled down to the reference voltage, Vref. As a result, the voltage at the control node is pulled up to VDD because the first PMOS transistor 204 turns on. The second PMOS transistor 208 subsequently is turned on and the voltage at the output node reaches VDDa. In this way, a logic high input signal (at a lower voltage level) is shifted to a logic high output signal (at a higher voltage level).

Subsequently, if the input signal is logic low, the control node initially remains at VDD. As a result, the first NMOS transistor 202 is turned on, while the output node starts discharging towards logic low through the first NMOS transistor 202. The first PMOS transistor 204 prevents the first NMOS transistor 202 from turning off before the output node is completely discharged. At the same time, the second NMOS transistor 208 is turned on because its gate is charged to VDDa by the third PMOS transistor 214, providing a positive feedback to discharge the output node quickly.

Figure 3:
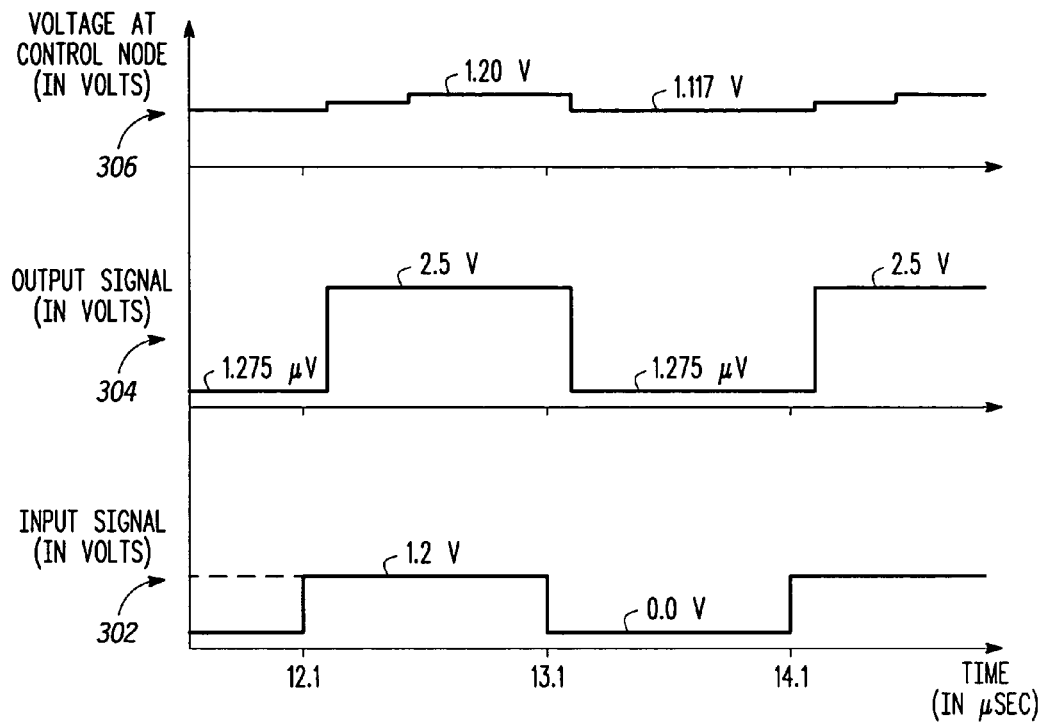
FIG. 3 is a waveform diagram for the circuit of FIG. 2, indicating the input signal, the output signal, and the signal at the control node of the level shifter.

The above-described behaviour of the level shifter 102 is illustrated using the waveforms in FIG. 3. FIG. 3 indicates the input signal, output signal and voltage at the control node with waveforms 302, 304 and 306, respectively. It will be noted from waveform 306 that the voltage at the control node remains sufficiently high to ensure that the output node gets discharged if the input signal is logic low. This is achieved by making the first PMOS transistor 204 relatively weak.

The capacitor 206 provides the start-up when the level shifter 102 is initially powered on. Since the capacitor 206 is connected to the high power supply voltage source 108, the capacitor 206 is charged to a maximum value of VDDa. Consequently, when the high power supply voltage source 108 is ramping up to its maximum value, and the input signal is logic low, the capacitor 206 ensures that the control node is at a voltage that is sufficiently high enough to turn on the first NMOS transistor 202 when the low logic input signal is applied, which provides a path to discharge the output node. The capacitor also helps prevent the control node from being discharged quickly.

In an alternate embodiment, a voltage divider circuit between the high power supply voltage source VDDa and the reference voltage Vref replaces the capacitor 206. This embodiment is hereinafter described in conjunction with FIG. 4.

Figure 4:
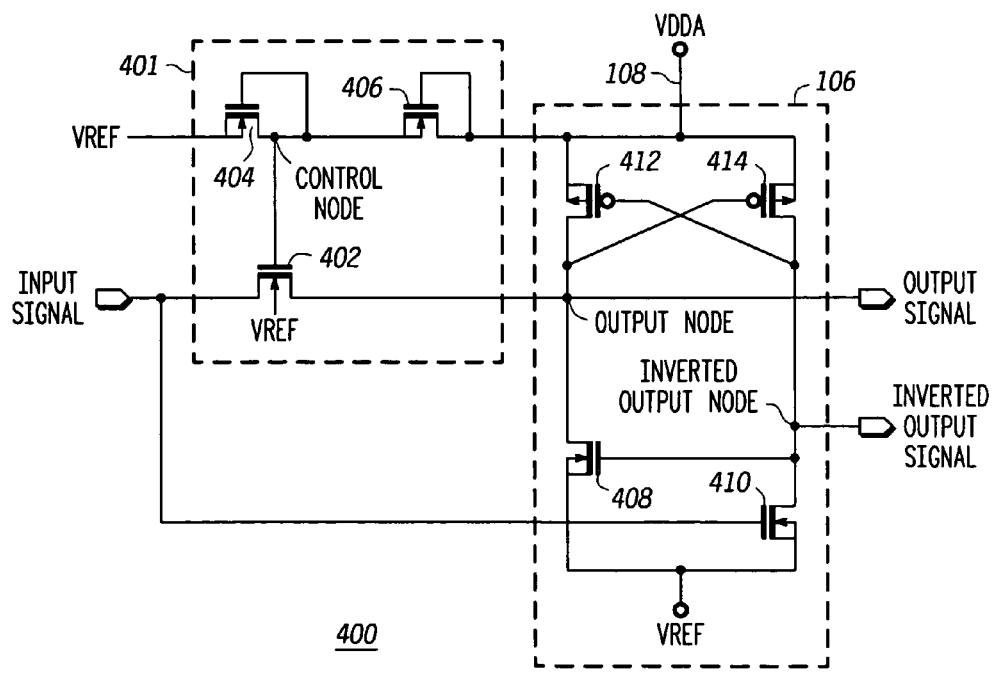
FIG. 4 is a schematic circuit diagram of a level shifter according to another embodiment of the present invention.

FIG. 4 is a schematic circuit diagram illustrating a level shifter 400 in accordance with another embodiment of the present invention. In this embodiment, the level shifter 400 includes a first unit 401 and the second unit 106 (shown in FIG. 2). The first unit 401 includes a first NMOS transistor 402 and a pair of series connected NMOS transistors referred to as a first series transistor 404 and a second series transistor 406. The second unit 106 comprises a second NMOS transistor 408, a third NMOS transistor 410, a second PMOS transistor 412, and a third PMOS transistor 414.

The source of the first NMOS transistor 402 receives the input signal. The drain of the first NMOS transistor 402 is connected to the drains of the second NMOS and second PMOS transistors 408 and 412 at the output node. The gate of the first NMOS transistor 402 is connected to the drain of the first series transistor 404 at the control node. The source of the first series transistor 404 is connected to the reference voltage Vref. The gate and drain of the first series transistor 404 are connected together at the control node. The source and bulk of the second series transistor 406 are connected to each other and to the drain of the first series transistor 404 at the control node. The gate and drain of the second series transistor 406 are connected to each other and to the high power supply voltage source 108.

The gate of the second NMOS transistor 408 is connected to the drain of the third NMOS transistor 410. The sources of the second and third NMOS transistors 408 and 410 are connected to the reference voltage Vref. The gate of the third NMOS transistor 410 receives the input signal. The source of the second PMOS transistor 412 is connected to the high power supply voltage source 108 and the drain of the second series transistor 406. The gate of the second PMOS transistor 412 is connected to the drain of the third NMOS transistor 410 at the inverted output node. The drain of the third PMOS transistor 414 is also connected to the drain of the third NMOS transistor 410 at the inverted output node. The source of the third PMOS transistor 414 is connected to the high power supply voltage source 108. The gate of the third PMOS transistor 414 is connected to the drain of the second NMOS transistor 408 at the output node.

The series transistors 404 and 406 are sized such that the voltage at the control node does not exceed the high level (VDD) of the input signal in order to prevent any leakage current from VDDa to VDD through the first NMOS transistor 402.

Figure 5:
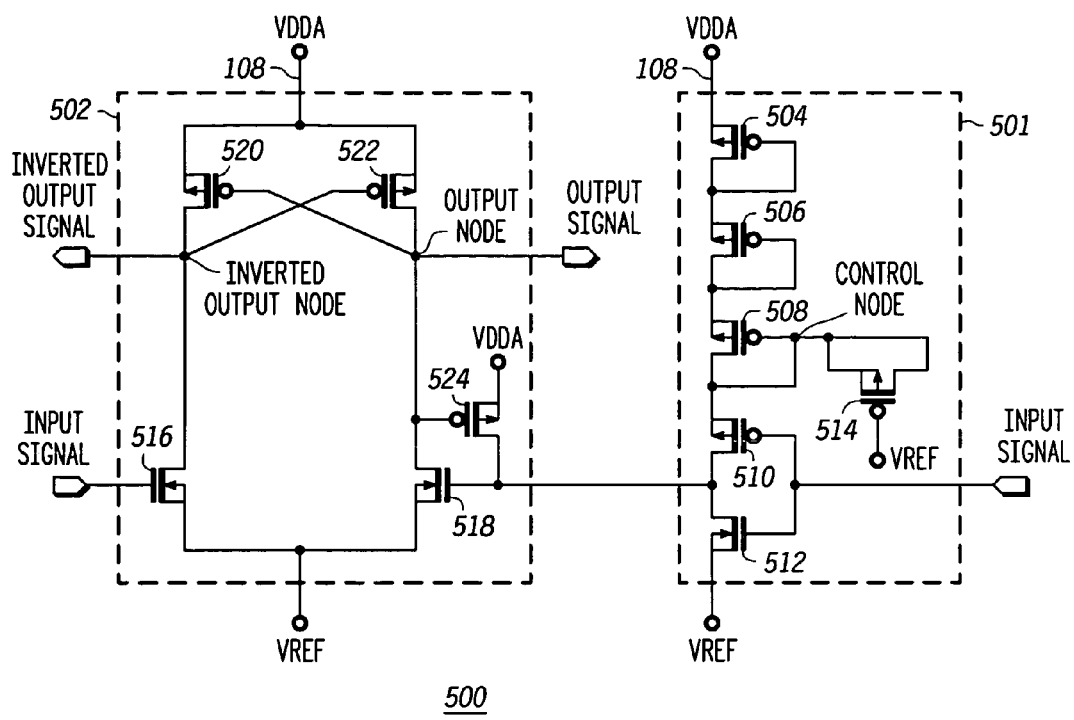
FIG. 5 is a schematic circuit diagram of a level shifter according to yet another embodiment of the present invention.

FIG. 5 is a schematic circuit diagram illustrating a level shifter 500 according to yet another embodiment of the present invention. The level shifter 500 includes a first unit 501 and a second unit 502. The first unit 501 comprises a first PMOS transistor 504, a second PMOS transistor 506, a third PMOS transistor 508, a fourth PMOS transistor 510, a first NMOS transistor 512, and a fifth PMOS transistor 514.

The second unit 502 comprises a second NMOS transistor 516, a third NMOS transistor 518, a sixth PMOS transistor 520, a seventh PMOS transistor 522, and an eighth PMOS transistor 524.

The source of the first PMOS transistor 504 is connected to the high power supply voltage source 108 (VDDa). The gate and drain of the first PMOS transistor 504 are connected together and to the source and bulk of the second PMOS transistor 506. The gate and drain of the second PMOS transistor 506 are connected together and to the source and bulk of the third PMOS transistor 508. The gate and drain of the third PMOS transistor 508 are connected together and to the source and bulk of the fourth PMOS transistor 510 at a control node. The gates of the fourth PMOS transistor 510 and first NMOS transistor 512 receive the input signal. The drains of the fourth PMOS transistor 510 and first NMOS transistor 512 are connected together and to the second unit 502. The source and bulk of the first NMOS transistor 512 are connected to the reference voltage Vref. The gate of the fifth PMOS transistor 514 also is connected to the reference voltage. The drain, source, and bulk of the fifth PMOS transistor 514 are connected to the gate of the third PMOS transistor 508 at the control node.

The gate of the second NMOS transistor 516 receives the input signal. The sources of the second and third NMOS transistors 516 and 518 are connected to the reference voltage. The gate of the third NMOS transistor 518 is connected to the drain of the fourth PMOS transistor 510 and to the drain of the eighth PMOS transistor 524. The drain of the sixth PMOS transistor 520 is connected to the drain of the second NMOS transistor 516. The gate of the sixth PMOS transistor 520 is connected to the drains of the third NMOS transistor 518 and the seventh PMOS transistor 522, and the gate of the eighth PMOS transistor 524 at an output node. The sources of the sixth, seventh and eighth PMOS transistors 520, 522 and 524 are connected to the high power supply voltage source 108. The gate of the seventh PMOS transistor 522 is connected to the drain of the second NMOS transistor 516 at the inverted output node.

The operation of the level shifters 400 and 500 illustrated in FIG. 4 and FIG. 5, respectively, is similar to that of the level shifter 102 illustrated in FIG. 2. In particular, the output signal and the voltage generated at the control node is similar in all three circuits.

While various embodiments of the invention have been illustrated and described, it will be clear that the invention is not limited only to these embodiments. Numerous modifications, changes, variations, substitutions and equivalents will be apparent to those skilled in the art, without departing from the spirit and scope of the invention, as described in the claims.

The invention claimed is:

1. A level shifter that shifts a low supply voltage input signal to a higher supply voltage output signal, the level shifter comprising:
   a first unit connected to a high power supply voltage source and receiving the input signal, the first unit acting as a startup circuit such that when the level shifter is powered on, the first unit discharges an output node if the input signal is a logic low; and
   a second unit connected to the first unit and the high power supply voltage source, and receiving the input signal, wherein the second unit shifts the input signal to the higher supply voltage output signal, and wherein the level shifter operates only at the high power supply voltage, wherein the first unit includes:
   a first NMOS transistor having source connected to the input signal, a bulk connected to a reference voltage, a drain connected to the second unit at the output node, and a gate; and
   a pair of series connected transistors, including a first series transistor and a second series transistor, wherein the first series transistor has a source and a bulk connected to the reference voltage, a drain connected to the gate of the first NMOS transistor at the control node, and a gate connected to its drain, and the second series transistor has a source connected to the control node, a bulk connected to its source, a drain connected to the second unit, and a gate connected to its drain.

2. The level shifter according to claim 1, wherein the second unit comprises:
   a second NMOS transistor having a source connected to the reference voltage, a drain connected to the output node, and a gate;
   a third NMOS transistor having a gate connected to the input signal, a source connected to the reference voltage, and a drain connected to the gate of the second NMOS transistor;
   a second PMOS transistor having a drain connected to the drain of the second NMOS transistor at the output node, a source connected to the high power supply voltage source and the drain of the second series transistor, and a gate; and
   a third PMOS transistor having a source connected to the high power supply voltage source, a drain connected to the gate of the second PMOS transistor and the drain of the third NHOS transistor, and a gate connected to the output node.

3. A level shifter that shifts a low supply voltage input signal to a higher supply voltage output signal, the level shifter comprising:
   a first NMOS transistor having a source connected to the input signal, a bulk connected to a reference voltage, and a drain connected to an output node;
   a first PMOS transistor having a source connected to the input signal, a drain connected to a gate of the first NMOS transistor at a control node, and a bulk connected to a high power supply voltage source;
   a capacitor having a first terminal connected to the high power supply voltage source and a second terminal connected to the gate of the first NMOS transistor and the drain of the first PMOS transistor at the control node;
   a second NMOS transistor having a source connected to the reference voltage, a drain connected to an output node, and a gate connected to a gate of the first PMOS transistor at an inverted output node;
   a third NMOS transistor having a gate connected to the input signal, a source connected to the reference voltage, and a drain connected to the gate of the second NMOS transistor;
   a second PMOS transistor having a drain connected to the drain of the second NMOS transistor at the output node, and a source connected to the high power supply voltage source; and
   a third PMOS transistor having a source connected to the high power supply voltage source, a drain connected to a gate of the second PMOS transistor and the drain of the third NMOS transistor, and a gate connected to the output node.

4. A level shifter that shifts a low supply voltage input signal to a higher supply voltage output signal, the level shifter comprising:

a first PMOS transistor having a source and a bulk connected to a high power supply voltage source, and a gate connected to its drain;

a second PMOS transistor having a source and a bulk connected to the drain of the first PMOS transistor, and a gate connected to its drain;

a third PMOS transistor having a source and a bulk connected to the drain of the second PMOS transistor, and a gate connected to its drain;

a fourth PMOS transistor having a source and a bulk connected to the drain of the third PMOS transistor, and a gate connected to the input signal;

a first NMOS transistor having a source and a bulk connected to a reference voltage, a drain connected to a drain of the fourth PMOS transistor, and a gate connected to the input signal and the gate of the fourth PMOS transistor;

a fifth PMOS transistor having a gate connected to the reference voltage, a source connected to the gate of the third PMOS transistor, a bulk connected to its source, and a drain connected to its source;

a second NMOS transistor having a source and a bulk connected to the reference voltage, and a gate connected to the input signal;

a third NMOS transistor having a source and a bulk connected to the reference voltage, and a gate connected to the drain of the fourth PMOS transistor;

a sixth PMOS transistor having a source and a bulk connected to the high power supply voltage source, and a drain connected to the drain of the second NMOS transistor;

a seventh PMOS transistor having a source and a bulk connected to the high power supply voltage source, a drain connected to the drain of the third NMOS transistor and a gate of the sixth PMOS transistor at an output node, and a gate connected to the drain of the sixth PMOS transistor; and an eighth PMOS transistor having a source and a bulk connected to the high power supply voltage, a drain connected to the gate of the third NMOS transistor, and a gate connected to the drain of the third NMOS transistor, wherein the higher power supply voltage signal is provided at the output node.

* * * * *